United States Patent
Uratsuji

(10) Patent No.: US 8,604,346 B2
(45) Date of Patent: Dec. 10, 2013

(54) FLEX-RIGID WIRING BOARD AND METHOD FOR MANUFACTURING THE SAME

(75) Inventor: Atsuhiro Uratsuji, Nomi (JP)

(73) Assignee: Sony Corporation, Tokyo (JP)

( * ) Notice: Subject to any disclaimer, the term of this patent is extended or adjusted under 35 U.S.C. 154(b) by 496 days.

(21) Appl. No.: 12/989,485

(22) PCT Filed: Apr. 23, 2009

(86) PCT No.: PCT/JP2009/058084
§ 371 (c)(1),
(2), (4) Date: Nov. 4, 2010

(87) PCT Pub. No.: WO2009/131182
PCT Pub. Date: Oct. 29, 2009

(65) Prior Publication Data
US 2011/0036619 A1 Feb. 17, 2011

(30) Foreign Application Priority Data
Apr. 25, 2008 (JP) .................. 2008-114871

(51) Int. Cl.
H05K 1/00 (2006.01)
H05K 3/02 (2006.01)
H05K 3/10 (2006.01)

(52) U.S. Cl.
USPC .......................................... 174/254; 29/846

(58) Field of Classification Search
USPC .............. 174/254; 361/749–751; 29/846–853
See application file for complete search history.

(56) References Cited

U.S. PATENT DOCUMENTS

2010/0051325 A1* 3/2010 Sato et al. ............... 174/254

FOREIGN PATENT DOCUMENTS

| JP | 05-145205 A | 6/1993 |
| JP | 07-106766 A | 4/1995 |
| JP | 2003-133728 A | 5/2003 |
| JP | 2006-269979 A | 10/2006 |
| JP | 2007-129087 A | 5/2007 |
| JP | 2007-134550 A | 5/2007 |
| JP | 2007-250884 A | 9/2007 |
| JP | 4024846 B1 | 10/2007 |

OTHER PUBLICATIONS

International Search Report dated Aug. 4, 2009 issued in International Appln. No. PCT/JP2009/058084.
International Preliminary Report on Patentability (IPRP) dated Dec. 23, 2010 (in English) in parent International Application No. PCT/JP2009/058084.

* cited by examiner

*Primary Examiner* — Jeremy Norris
(74) *Attorney, Agent, or Firm* — Wolf, Greenfield & Sacks, P.C.

(57) ABSTRACT

Provided are a flex-rigid wiring board having an increased shielding effect and improved productivity with reduced number of manufacturing process steps, and a method for manufacturing the flex-rigid wiring board. The flex-rigid wiring board consists of a flexible cable section (32) having a shielding layer (45) on an outer surface, and a rigid mounting section (34) having a wiring layer (47) provided on the same surface as the shielding layer (45). The shielding layer (45) and the wiring layer (47) are made of a same sheet of continuous copper foil (46). The wiring layer (47) is plated and is made thicker than the shielding layer (45). A same continuous insulating layer (48) is provided on outer sides of the shielding layer (45) and the wiring layer (47) of the mounting section (34).

18 Claims, 3 Drawing Sheets

FLEX-RIGID WIRING BOARD AND METHOD FOR MANUFACTURING THE SAME

This application is a U.S. National Phase Application under 35 USC 371 of International Application PCT/JP2009/058084 filed Apr. 23, 2009.

TECHNICAL FIELD

The present invention relates to a flex-rigid wiring board including a flexible cable section which is integrally formed with and extends from a mounting section on which various electronic circuits are mounted. The present invention also relates to a method for manufacturing the flex-rigid wiring board.

BACKGROUND ART

Flexible wiring boards with a desired wiring pattern formed on a surface of an insulating film have been used in various types of equipment. Especially in recent years, flex-rigid wiring boards consisting of a mounting section on which electronic circuits are mounted and a flexible cable section extending from the mounting section have been used frequently in various types of electronic equipment.

As illustrated in FIG. 3, a flex-rigid wiring board 2 consists of a flexible section A in which cables are wired and a rigid section B on which circuits and electric elements are mounted. The flexible section A and the rigid section B are formed integrally with each other. Shields 4 for blocking external noise and preventing leakage of noise generated by wiring are attached to areas extending from near a boundary of the flexible section A and the rigid section B to an outer surface of the flexible section A. The shields 4 are made of a film over which a silver particle-containing conductive coating material is applied.

A method of manufacturing the flex-rigid wiring board 2 is as follows: First, a copper clad laminate 10 which is constituted by a base film 6 made of, for example, polyimide having sheets of copper foil 8 attached on both sides is provided. A through hole 11 is formed by, for example, drilling, at a predetermined position in the rigid section B, which is to be formed as the mounting section. Next, surfaces of the copper foil 8 and an inside surface of the through hole 11 are plated with copper to a predetermined thickness to form a plated through hole 12. The sheets of copper foil 8 which are plated are then etched through masks having predetermined circuit patterns to form circuit patterns in the flexible section A and the rigid section B, thereby providing wiring layers. The copper clad laminate 10 is then laminated, on both sides thereof, with insulating films 13 made of, for example, polyimide. Sheets of thin copper foil 16 are attached to the flexible section A and the rigid section B by thermo-compression bonding.

In this state, via holes 14 are formed by, for example, laser to reach the underlying wiring layers at predetermined positions. Then, in a desmearing process, smears as residues of the manufacturing process adhering to the via holes 14 and other places are removed with, for example, chemicals. The copper foil 16 and inside surfaces of the via holes 14 are then plated with copper. The sheets of copper foil 16 which are plated are then etched in the same manner as described above to remove the sheets of copper foil 16 in the flexible section A. Predetermined circuit patterns are formed in the rigid section B, thereby providing wiring layers.

Next, outer layer sides of the rigid section B are laminated with glass epoxy prepregs 18 and sheets of copper foil 20. The prepregs 18 are cured so that the sheets of copper foil 20 would be bonded to the rigid section B. Via holes 22 or other parts are formed at predetermined positions and the sheets of copper foil 20 are then plated. Predetermined circuit patterns are formed by etching in the same manner as described above and solder resists 24 are applied over the circuit patterns, i.e., over the outer surfaces of the rigid section B. Subsequently, the shields 4 over which a conductive silver coating material is applied are attached to areas extending from an end of the rigid section B to the flexible section A. In this manner, the flex-rigid wiring board 2 is completed.

As disclosed in Patent Document 1, there is also proposed a flex-rigid multilayer substrate in which a mounting section and a cable section have wiring layers of flex-rigid wiring boards of different thickness. Considering the fact that thickness of an insulating layer provided between a shielding layer and, for example, circuit wiring and a thickness and width of the circuit wiring affect the characteristic impedance of the circuit, the wiring in the cable section having a thin insulating layer between the wiring and the shielding layer is made thinner than the wiring of the mounting section in this flex-rigid multilayer substrate. In this manner, the mounting section and the cable section are consistent in the characteristic impedance.

Patent Document 2 discloses a structure of a flexible printed circuit board in which a circuit pattern or other copper foil in a mounting section of the flexible printed circuit board is thick so that the mounting section would be rigid and in which copper foil of wiring in a cable section is thin so that the cable section would be flexible.

Patent Document 1: Japanese Patent Application Laid-open No. H7-106766

Patent Document 2: Japanese Patent Application Laid-open No. 2007-250884

SUMMARY OF THE INVENTION

Problems to be Solved by the Invention

In the structure of the above-described related art flex-rigid wiring board illustrated in FIG. 3, the shields are attached in an additional process after the manufacturing process of the flex-rigid wiring board is completed. There is, therefore, a problem of low productivity. Since the shields are layers of a silver particle-containing conductive coating material, electrical connection resistance between the shields and a grounding portion of the flex-rigid wiring board is high and, therefore, shielding performance is low. In addition, the shields made of a conductive silver coating material are expensive, which contributes to the high cost of the flex-rigid wiring board.

In the flex-rigid multilayer substrate disclosed in Patent Document 1, a step of reducing the thickness of the wiring layer should be included in the manufacturing process and, therefore, the number of process steps increases. In addition, a step of forming a shielding layer should also be included.

In the flexible printed circuit board disclosed in Patent Document 2, a step of increasing a thickness of plating of a conductive layer should be included in order to provide rigidity to the mounting section. Since mechanical strength of the mounting section is provided by the conductive layer of copper foil, such a structure consumes a large amount of copper foil, is heavy in weight and high in cost.

The present invention has been made in view of the foregoing background art and an object thereof is to provide a flex-rigid wiring board having an increased shielding effect and improved productivity with reduced number of manufacturing process steps, and a method for manufacturing the flex-rigid wiring board.

Means for Solving the Problems

The present invention is a flex-rigid wiring board consisting of a flexible cable section having a shielding layer on an outer surface, and a rigid mounting section having a wiring layer provided on the same surface as the shielding layer, wherein the shielding layer and the wiring layer are made of a same sheet of continuous metal foil, and the wiring layer is plated and is made thicker than the shielding layer.

A same continuous insulating layer is provided on outer sides of the shielding layer and the wiring layer of the mounting section.

The invention is a method for manufacturing a flex-rigid wiring board consisting of a flexible cable section having a shielding layer on an outer surface, and a rigid mounting section having a wiring layer provided on the same surface as the shielding layer, including the steps of: providing a core substrate which has the wiring layer and extends continuously from the mounting section to the flexible section, and laminating the core substrate, via an insulating layer, with a sheet of metal foil which is thinner than the wiring layer; masking an area which is to be formed as the cable section among the sheet of metal foil with a resist material; and plating an area of the metal foil which is not masked and is to be formed as the mounting section to increase a thickness of a metal layer, wherein an area of the sheet of metal foil which is masked in the cable section is to be formed as the shielding layer.

An insulating layer is provided on outer sides of the shielding layer and the wiring layer of the mounting section in the same step.

Effect of the Invention

According to the flex-rigid wiring board and the method for manufacturing the same of the present invention, the shielding layer can be formed easily in the manufacturing process of the flex-rigid wiring board with improved productivity and significantly reduced cost. In addition, connection resistance between the grounding portion of the wiring layer and the shielding layer is low and, therefore, the shielding effect is increased. Accordingly, a flex-rigid wiring board with increased shielding performance can be provided at low cost.

DESCRIPTION OF EMBODIMENTS

Figure 1:
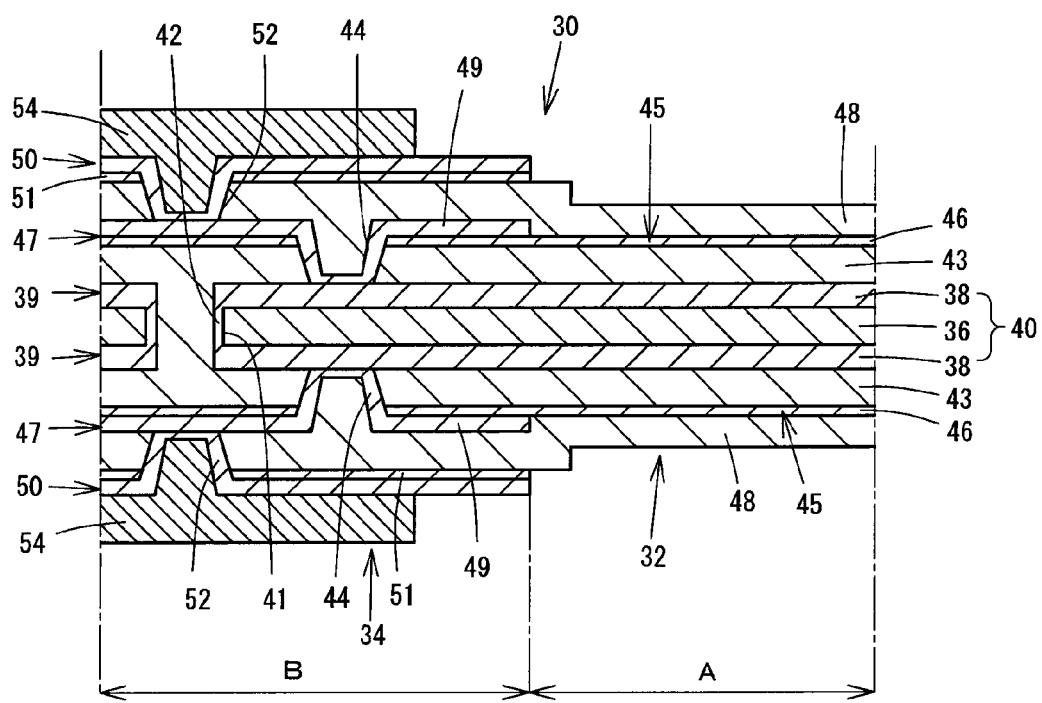
FIG. 1 is a schematic longitudinal sectional view illustrating a flex-rigid wiring board according to an embodiment of the present invention.
Figure 2:
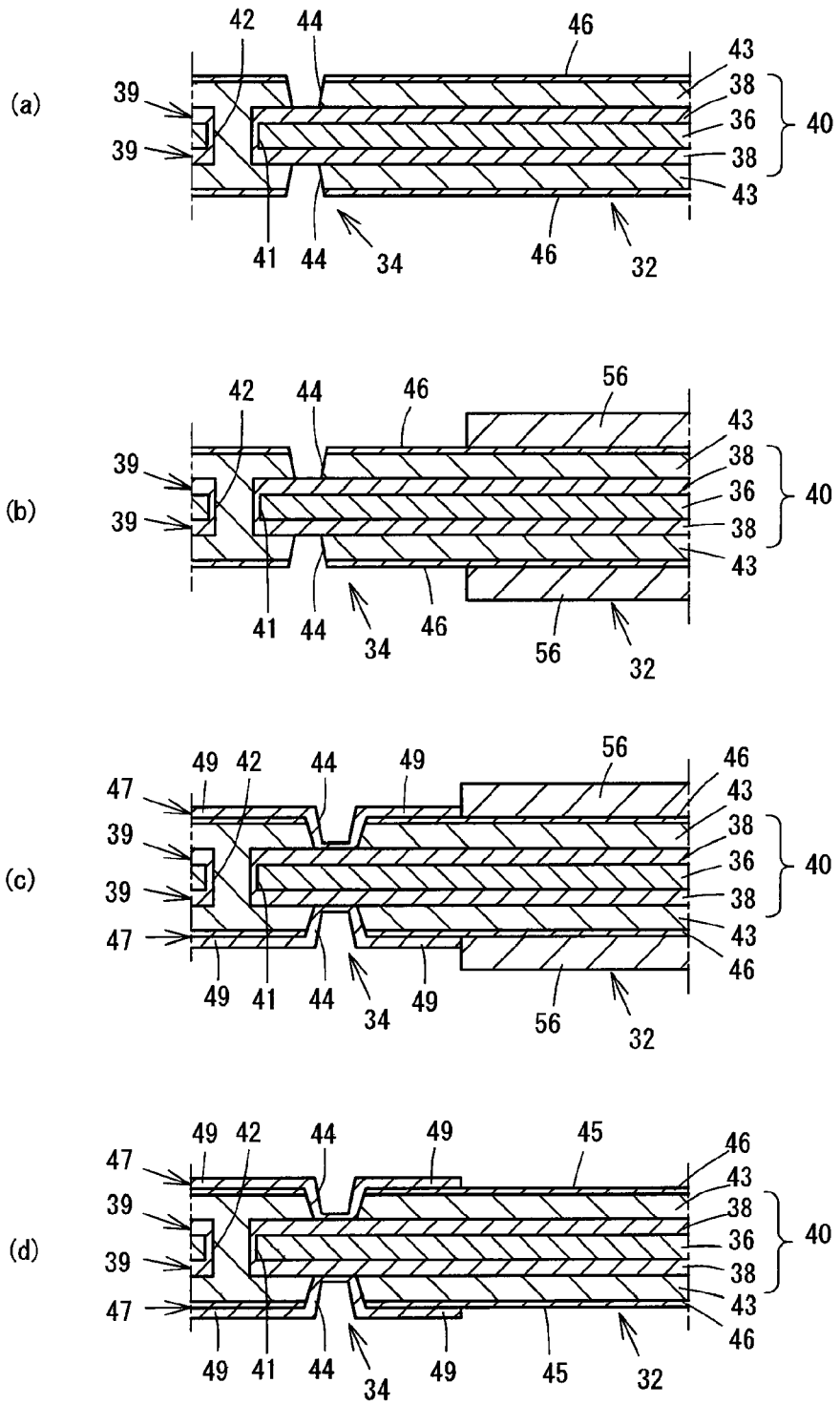
FIGS. 2A to 2D are schematic longitudinal sectional views illustrating manufacturing process steps of the flex-rigid wiring board according to the present embodiment.
Figure 3:
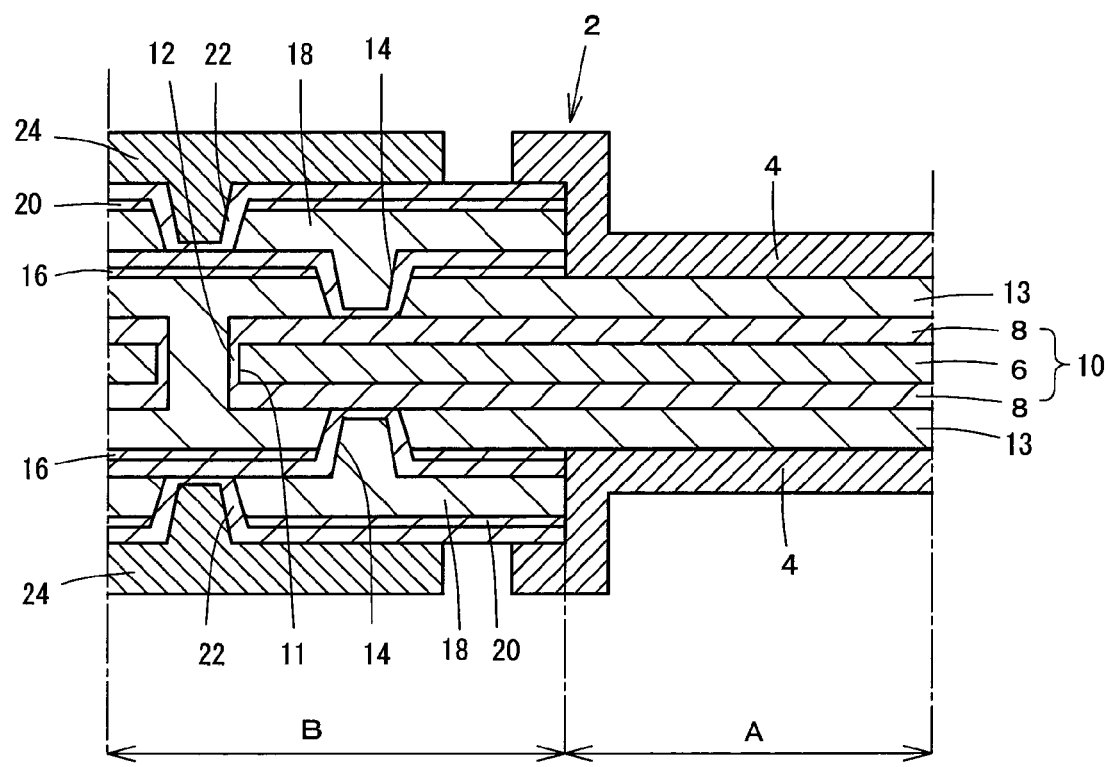
FIG. 3 is a schematic longitudinal sectional view of a related art flex-rigid wiring board.

Hereinafter, an embodiment of a flex-rigid wiring board according to the present invention will be described with reference to FIGS. 1 and 2. As illustrated in FIG. 1, a flex-rigid wiring board 30 of the present embodiment consists of a cable section 32 which is made of an elastic flexible section A and a mounting section 34 which is a stiff rigid section B. The flexible section A and the mounting section B are formed integrally with and continuously to each other. A copper clad laminate 40 is provided at the center of the flex-rigid wiring board 30. The copper clad laminate 40 is constituted by a base film 36 and sheets of copper foil 38 attached on both sides of the base film 36. The base film 36 is made of, for example, polyimide and is, for example, about 10 to 50 micrometers thick. The copper foil 38 is several to several tens of micrometers thick.

A through hole 41 is formed by, for example, drilling, at a predetermined position in an area which is to be formed as the mounting section 34 of the copper clad laminate 40. An inside surface of the through hole 41 is plated with copper to a predetermined thickness to form a plated through hole 42. Wiring as cables is formed in the sheets of copper foil 38 on both sides of the cable section 32. Predetermined circuit patterns which form electronic circuits are formed in the sheets of copper foil 38 on both sides of the mounting section 34, thereby providing wiring layers 39.

Insulating layers 43 made of insulating films of, for example, polyimide are formed on the wiring layers 39 on both sides of the cable section 32 and the mounting section 34. The insulating layers 43 are laminated, on outer sides thereof, with sheets of copper foil 46 which are about 3 to 12 micrometers thick and are thinner than the wiring layers 39. The sheets of copper foil 46 are to be formed as shielding layers 45 in the cable section 32 and constitute a part of wiring layers 47 in the mounting section 34. Copper plating 49 is formed on the sheets of copper foil 46 to increase thicknesses of the wiring layers 47, which are formed in predetermined circuit patterns. Via holes 44 are formed at predetermined positions in the circuit patterns to provide electrical connections with the underlying wiring layers 39.

The wiring layers 47 and the shielding layers 45 are laminated, on outer sides thereof, with insulating layers 48 made of, for example, polyimide. Wiring layers 50 and via holes 52 are formed in the mounting section 34 and solder resists 54 are applied to outer surfaces of the wiring layers 50 and the via holes 52 to provide the flex-rigid wiring board 30.

A method for manufacturing the flex-rigid wiring board 30 will be described. As illustrated in FIG. 2A, the through hole 41 for the plated through hole 42 is formed by, for example, drilling in the mounting section 34 of the copper clad laminate 40 which is a core substrate. Next, an inside surface of the through hole 41 and surfaces of the sheets of copper foil 38 are plated with copper to a predetermined thickness to form the plated through hole 42. At the same time, the sheets of copper foil 38 for the wiring layers 39 are plated. The sheets of copper foil 38 which are plated are then etched through masks having predetermined circuit patterns to form circuit patterns in the cable section 32 and the mounting section 34. The sheets of copper foil 38 are laminated, on both sides, with the insulating layers 43 which are films of, for example, polyimide. Sheets of thin copper foil 46 are attached to the insulating layers 43 by thermo-compression bonding. Holes are then formed by, for example, laser to reach the underlying circuit patterns at predetermined positions to provide via holes 44.

Then, in a desmearing process, smears as residues of the manufacturing process adhering to the via holes 44 and other places are removed with, for example, chemicals. As illustrated in FIG. 2B, the cable section 32 is covered with resists 56. As illustrated in FIG. 2C, copper plating 49 is formed on the sheets of copper foil 46 and on inside surfaces of the via holes 44. Then, as illustrated in FIG. 2D, the resists 56 are removed from the cable section 32.

Next, masks having predetermined circuit patterns are provided by resists for circuits on the sheets of copper foil 46 which are plated in the same manner as described above. Masks are also applied to the sheets of copper foil 46 on the shielding layers 45 of the cable section 32. The sheets of copper foil 46 are then etched to form circuit patterns of the wiring layers 47.

Next, as illustrated in FIG. 1, the insulating layers 48 made of, for example, polyimide and sheets of copper foil 51 are laminated by thermo-compression bonding such that the cable section 32 and the mounting section 34 might be covered. The sheets of copper foil 51 are plated and via holes 52 are formed in the same manner as described above to provide the wiring layers 50 of predetermined circuit patterns. Then, solder resists 54 are applied and the flex-rigid wiring board 30 is provided.

According to the flex-rigid wiring board 30 of the present embodiment, the shielding layers 45 can be formed easily in the manufacturing processes of the flex-rigid wiring board 30 without any substantial increase in the number of manufacturing process steps. Thus, the manufacturing cost of the flex-rigid wiring board 30 can be reduced significantly. In addition, since electrical connection resistance between the grounding portions of the wiring layers 47 and the shielding layers 45 is low, the shielding effect is high. The insulating layers 48 on the outer sides of the shielding layers 45 are formed by laminating the cable section 32 and the mounting section 34 with the same insulating films. Such insulating layers 48 provide a reliable insulating effect and improved workability and thereby contribute to the cost reduction.

It should be noted that the flex-rigid wiring board and the method for manufacturing the same according to the present invention are not limited to those of the above-described embodiment. The cable section and the mounting section may be made of materials other than polyimide. For example, the insulating layers may be made of polyester or a flexible glass epoxy material depending on the intended use. Metal foil of gold and aluminum other than copper foil may also be used as long as it provides a shielding effect in the structure and processes similar to those in the above-described embodiment.

REFERENCE NUMERALS

30 flex-rigid wiring board
32 cable section
34 mounting section
36 base film
38, 46 copper foil
40 copper clad laminate
39, 47, 50 wiring layers
43, 48 insulating layers
45 shielding layer

The invention claimed is:

1. A flex-rigid wiring board comprising:
a flexible cable section comprising a metal clad laminate core and a shielding layer on an outer surface outward from the metal clad laminate core; and
a rigid mounting section having a wiring layer provided on the same surface as the shielding layer, wherein:
the shielding layer and the wiring layer are made of a same sheet of continuous metal foil, and the wiring layer is plated and is made thicker than the shielding layer.

2. The flex-rigid wiring board according to claim 1, further comprising:
a same continuous insulating layer provided on outer sides of the shielding layer and the wiring layer of the mounting section.

3. The flex-rigid wiring board according to claim 2, further comprising:
a metal layer provided on outer sides of the continuous insulating layer.

4. The flex-rigid wiring board according to claim 3, further comprising:
a solder resist provided on outer sides of the metal layer.

5. The flex-rigid wiring board according to claim 1, wherein the outer surface is a surface of an insulating layer.

6. The flex-rigid wiring board according to claim 5, wherein the insulating layer comprises polyimide.

7. The flex-rigid wiring board according to claim 1, wherein the shielding layer comprises copper.

8. The flex-rigid wiring board according to claim 1, wherein the shielding layer has a thickness falling in the range of 3 to 12 micrometers.

9. The flex-rigid wiring board according to claim 1, wherein the metal clad laminate core is a copper clad laminate core.

10. The flex-rigid wiring board according to claim 1, wherein the metal clad laminate core comprises a base film.

11. The flex-rigid wiring board according to claim 10, wherein the base film comprises polyimide.

12. A method for manufacturing a flex-rigid wiring board consisting of a flexible cable section having a shielding layer on an outer surface, and a rigid mounting section having a wiring layer provided on the same surface as the shielding layer, the method comprising:
laminating a metal clad laminate core with an insulating layer;
providing a sheet of metal foil thinner than the wiring layer on an outer surface of the insulating layer;
masking an area of the sheet of metal foil which is to be formed as the cable section with a resist material; and
plating an area of the sheet of metal foil which is not masked and is to be formed as the mounting section to form the wiring layer with a thickness greater than the shielding layer, wherein:
an area of the sheet of metal foil which is masked in the cable section is to be formed as the shielding layer.

13. The method for manufacturing the flex-rigid wiring board according to claim 12, wherein the insulating layer is a first insulating layer and the method further comprises:
providing a second insulating layer on outer sides of the shielding layer and the wiring layer of the mounting section in the same act.

14. The method for manufacturing the flex-rigid wiring board according to claim 12, wherein the insulating layer comprises polyimide.

15. The method for manufacturing the flex-rigid wiring board according to claim 12, wherein the sheet of metal foil is a sheet of copper foil.

16. The method for manufacturing the flex-rigid wiring board according to claim 12, the method further comprising:
removing the resist material.

17. The method for manufacturing the flex-rigid wiring board according to claim 12, the method further comprising:
forming, in the rigid mounting section, at least one via hole through at least the sheet of metal foil and the insulating layer.

18. The method for manufacturing the flex-rigid wiring board according to claim 17, the method further comprising:
performing a desmearing process after forming the at least one via hole.

* * * * *